(12) United States Patent
Nagasawa et al.

(10) Patent No.: US 6,271,685 B1
(45) Date of Patent: *Aug. 7, 2001

(54) SEMICONDUCTOR INTEGRATED CIRCUIT

(75) Inventors: Kazuhiro Nagasawa, Nara; Kazuya Fujimoto, Tenri; Shigeki Imai, Nara, all of (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/195,198

(22) Filed: Nov. 18, 1998

(30) Foreign Application Priority Data

Dec. 25, 1997 (JP) ................................... 9-358575

(51) Int. Cl.$^7$ ................. H03K 19/094; H03K 19/0175; H03K 19/01
(52) U.S. Cl. ................. 326/113; 326/88; 326/17
(58) Field of Search .................. 326/113, 88, 86, 326/82, 83, 119, 121, 112, 17

(56) References Cited

U.S. PATENT DOCUMENTS

| | | | |
|---|---|---|---|
| 3,774,055 | * 11/1973 | Bapat | 326/97 |
| 3,845,324 | * 10/1974 | Feucht | 326/119 |
| 3,898,479 | * 8/1975 | Proebsting | 326/88 |
| 4,316,106 | * 2/1982 | Young et al. | 326/88 |
| 4,408,136 | * 10/1983 | Kirsh | 326/70 |
| 4,443,720 | * 4/1984 | Takemae | 327/541 |
| 4,446,567 | * 5/1984 | Iida et al. | 377/79 |
| 4,500,799 | * 2/1985 | Sud et al. | 326/107 |
| 4,570,085 | 2/1986 | Redfield . | |
| 4,622,479 | * 11/1986 | Taylor | 326/88 |
| 5,184,035 | * 2/1993 | Sugibayashi | 326/88 |
| 5,327,026 | * 7/1994 | Hardee et al. | 326/88 |
| 5,654,660 | 8/1997 | Orgill et al. . | |
| 5,694,061 | 12/1997 | Morosawa et al. . | |
| 5,917,348 | * 6/1999 | Chow | 327/108 |

FOREIGN PATENT DOCUMENTS 58-162126   9/1983 (JP) .

OTHER PUBLICATIONS

"XP002097267 Enhancement/Depletion Decoder Circuit," Dockerty et al., IBM Technical Disclosure Bulletin, vol. 19, No. 5, Oct. 1976, pp. 1681–1682.

"XP002097268 Dynamic depletion circuits upgrade MOS performance," Clay Cranford, Electronics, vol. 54, No. 13, Jun. 1981, pp. 128–129.

"XP–002097269 Pass Transistor Realization of a General Boolean Function," M. Y. Tsai, IBM Technical Disclosure Bulletin, vol. 26, No. 1, Jun. 1983, pp. 35–39.

Nikkei Business Publication "White paper on low power consumption LSIs"; pp. 98–106; 1994.

Akilesh Parameswar et al. "A High Speed, Low Power, Swing Restored Pass–Transistor Logic Based Multiply and Accumulate Circuit For Multimedia Applications", PROC. IEEE 1994 CICC, pp. 278–281, May 1994.

K. Yano et al. "A 3.8–ns CMOS 16×16–b Multiplier Using Complementary Pass–Transistor Logic", IEEE J. Solid–State Circuits., vol. 25, No. 2, pp. 388–395, Apr. 1990.

* cited by examiner

Primary Examiner—Michael Tokar
Assistant Examiner—James H Cho

(57) ABSTRACT

A semiconductor integrated circuit includes a pass transistor logic circuit and an output buffer. The output buffer compensates for an output level of the pass transistor logic circuit. Preferably, the output buffer includes a bootstrap circuit with a capacitor. The capacitor is preferably connected between a gate of an output transistor and an output terminal. Such an arrangement allows for the obtaining of a high voltage at the output terminal.

12 Claims, 6 Drawing Sheets

SEMICONDUCTOR INTEGRATED CIRCUIT

BACKGROUND OF THE INVENTION

1. Field of the Invention

The present invention relates to a semiconductor IC (Integrated Circuit) having a pass transistor logic circuit. More particularly, the present invention relates to a semiconductor IC with an improved production yield and a reduced cost.

2. Description of the Related Art

In recent years, there have been growing demands for reducing power consumption, increasing an operating speed and reducing a chip area of a semiconductor IC. In order to meet such demands, "White paper on low power consumption LSIs", pp.98–104, Nikkei Business Publications Inc., for example, has proposed a circuit configuration using a pass transistor logic.

In the pass transistor logic circuit proposed in this publication, a logic circuit is formed by NMOS transistors, whereby transmission of a low level signal is desirable. However, a voltage level of a high level signal being output is reduced by a threshold value of the NMOS transistor due to a substrate effect.

In view of this, other conventional pass transistor logic circuits have been proposed, as will be described below, which employ various measures to pull up the reduced high level signal (which has been reduced by the threshold value of the NMOS transistor) to the desired high level. This is done to obtain a sufficient driving capacity for a subsequent-stage circuit.

A CPL (Complementary Pass-Transistor Logic) proposed by Hitachi Ltd. has been proposed with a CMOS inverter at an output section for restoring a blunted high logic level to its original level, and a PMOS cross-coupled latch for suppressing a static current of the CMOS inverter, thereby augmenting the driving force for a subsequent-stage load. For more details, see "K. Yano, T. Yamanaka, T. Nishida, M. Saito, K. Shimohigashi, and A. Shimizu, "A 3.8 ns CMOS 16×16-b Multiplier Using Complementary Pass-Transistor Logic", IEEE J. Solid-State Circuits., Vol. 25, No. 2, pp. 388–395 (1990)".

Another conventional example is an SRPL (Swing Restored Pass-Transistor Logic) proposed by Toshiba Corporation, which uses a CMOS latch for ensuring that the output reaches the desired level. For more details, see "A. Parameswar, H. Hara and T. Sakurai, "A high Speed, Low Power, Swing Restored Pass-Transistor Logic Based Multiply and Accumulate Circuit for Multimedia Applications", Proc. IEEE 1994 CICC, pp. 278–281, May 1994.

In these conventional pass transistor logic circuits, a CMOS buffer is provided for every predetermined number of serially-connected transistors for restoring a signal level.

Thus, conventionally, in order to reduce power consumption, increase an operating speed and reduce a chip area of an LSI using a pass transistor logic circuit in place of a CMOS logic circuit, a PMOS transistor is necessary for driving a high level signal.

However, a PMOS transistor has an operating speed which is about ⅓ of that of an NMOS transistor due to the carrier mobility difference therebetween. This spoils the characteristic of a pass transistor logic circuit being faster than a CMOS logic circuit.

Conventionally, in order to increase the operating speed of the PMOS transistor to a level comparable to that of an NMOS transistor, it is necessary to provide a PMOS transistor which is larger than an NMOS transistor. However, this makes it difficult to reduce the chip area.

In addition, since a logic circuit in the pass transistor logic circuit is formed by NMOS transistors, the relative size of the NMOS transistor region with respect to the PMOS transistor region is often larger as compared with that of a CMOS logic circuit. Therefore, with a layout method conventionally used in a CMOS process, some area is likely to be wasted in a P well. As a result, the chip area for a certain number of transistors is likely to be larger than that in the conventional CMOS logic circuit.

For the two reasons set forth above, it has been difficult to reduce the chip area in a semiconductor IC using the conventional pass transistor logic circuit.

SUMMARY OF THE INVENTION

According to one aspect of this invention, a semiconductor integrated circuit includes: a pass transistor logic circuit; and an output buffer for compensating for an output level of the pass transistor logic circuit, wherein the output buffer comprises a bootstrap circuit.

In one embodiment of the invention, the bootstrap circuit is additionally provided with a driving force complementary transistor.

In one embodiment of the invention, the pass transistor logic circuit consists of NMOS transistors.

Features of the present invention will now be described.

The present invention employs a bootstrap circuit for restoring a blunted high level output of a pass transistor logic circuit so as to obtain a sufficient drive capacity of the high level signal for a subsequent-stage circuit.

By using the bootstrap circuit, it is possible to increase a high level output which has been blunted through an NMOS transistor to a power supply voltage ($V_{DD}$) without using a PMOS transistor, as illustrated in FIGS. 1 and 2.

As a result, according to the present invention, a pass transistor logic circuit can be formed only with NMOS transistors, whereby it is possible to reduce the chip area as compared with the conventional pass transistor logic circuit which uses a PMOS transistor as necessary. Thus, it is possible to reduce the chip area of the pass transistor logic circuit while reducing the power consumption and increasing the operating speed.

In addition, according to the present invention, it is possible to produce a semiconductor IC with a conventional NMOS process, which is simpler than the CMOS process, thereby considerably reducing the turn around time.

Moreover, a PMOS region is not necessary, which also facilitates the reduction of the chip area.

Furthermore, when a driving force complementary transistor is additionally provided, the power consumption of the semiconductor IC can be further reduced for reasons set forth in the following description of the preferred embodiments.

Thus, the invention described herein makes possible the advantage of providing a semiconductor IC in which a chip area can be reduced while reducing the power consumption and increasing the operating speed, thereby improving the production yield thereof and reducing the cost therefor.

This and other advantages of the present invention will become apparent to those skilled in the art upon reading and understanding the following detailed description with reference to the accompanying figures.

DESCRIPTION OF THE PREFERRED EMBODIMENTS

The present invention will now be described by way of illustrative examples with reference to the accompanying figures.

Exemplary Bootstrap Circuit

Figure 1:
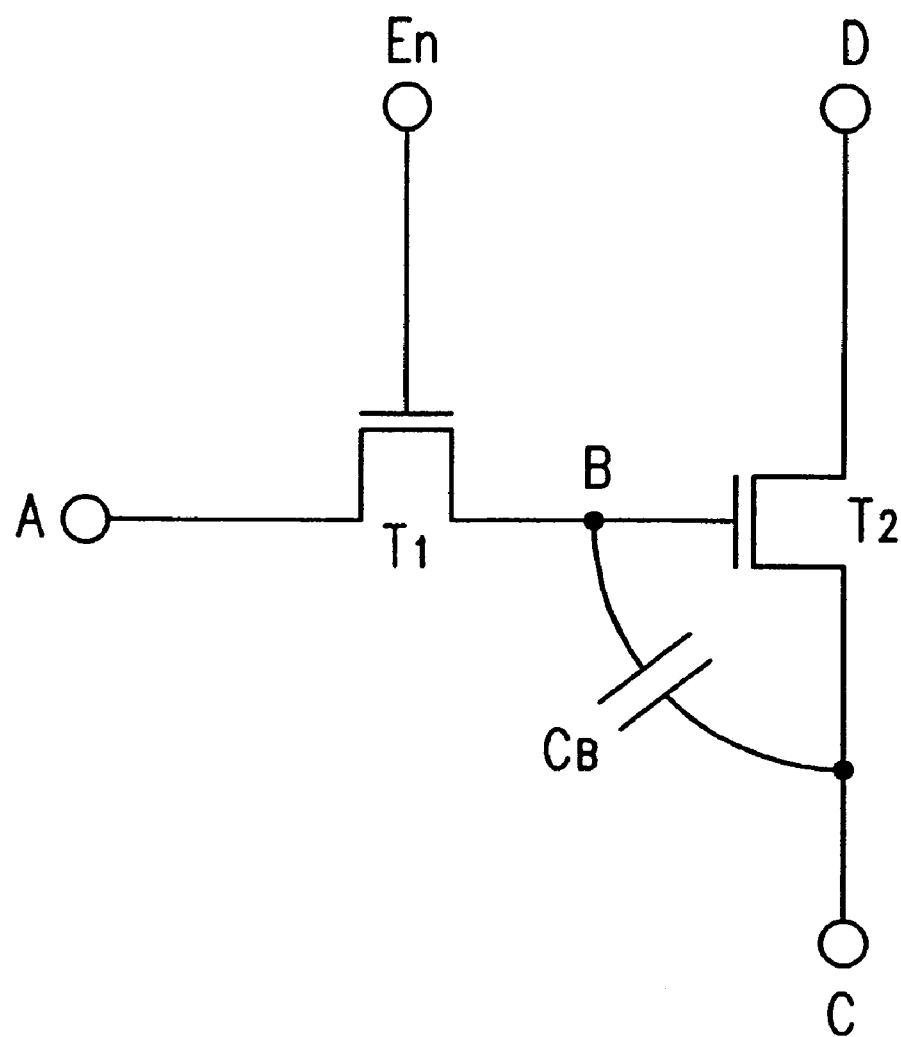
FIG. 1 is a circuit diagram illustrating a bootstrap circuit for use with the present invention.

FIG. 1 illustrates an exemplary bootstrap circuit which can be used as an output buffer of a semiconductor IC having a pass transistor logic circuit according to the present invention. A bootstrap circuit is a kind of booster circuit for example generating a saw tooth wave with good linearity. The bootstrap circuit of FIG. 1 includes an NMOS transistor $T_2$, an NMOS separation transistor $T_1$ and a capacitor (bootstrap capacitor) $C_B$ provided between the gate and the source of the NMOS transistor $T_2$.

FIG. 1 illustrates nodes (terminals) A, C, D and En, and a gate node B of the NMOS transistor $T_2$.

In this circuit configuration, the separation transistor $T_1$ is allowed to float when the gate node B of the NMOS transistor $T_2$ has been established at a high potential level. Therefore, it is possible to augment a high level output which has been previously reduced through the NMOS transistor $T_2$ to the power supply voltage. Thus, with this bootstrap circuit, it is possible to obtain a high voltage and a high inductance without using a PMOS transistor.

The operation principle of the bootstrap circuit of FIG. 1 will now be described. Referring to FIG. 1, when a high level voltage ($V_{DD}$) is applied to the node A while the node En is at a high level, the gate node B is charged to $V_{DD}-V_{TH}$ ($V_{TH}$: threshold voltage of the NMOS transistor $T_1$). Then, when the voltage level at the node En goes low, the gate node B is floating although the node B maintains the $V_{DD}-V_{TH}$ level at that moment.

When the voltage level at the node D is increased from $V_{SS}$ to $V_H(=V_{DD})$, the gate node B of the NMOS transistor $T_2$ is floating while being applied with a voltage $V_{DD}-V_{TH}$. Thus, the NMOS transistor $T_2$ also acts like a bootstrap circuit by its own gate capacitance (a capacity between an input terminal and the gate node B).

As a result, the voltage at the node C also increases to $V_H$. On the other hand, the voltage at the node B (gate node B) increases to $V_H+V_{DD}-V_{TH}$ by the potential at the node C due to the coupling of the capacitor $C_B$, with maintaining the initial voltage difference $V_{DD}-V_{TH}$. Thus, it is possible to drive the node C to a potential equal to that at the node D without dropping the voltage by the threshold voltage of $T_2$.

Next, the above-described operation principle will be described in greater detail referring to FIG. 2. As described above, when a high level voltage is applied to the node A while the node En is at the high level, the node B is charged to the high level ($V_{DD}-V_{TH}$).

Then, when the node En goes low, the node B is floating while maintaining the $V_{DD}-V_{TH}$ level. At this point, since the NMOS transistor $T_2$ is "ON", if the node D is at the low level, the low level is also transmitted to the node C.

Figure 2:
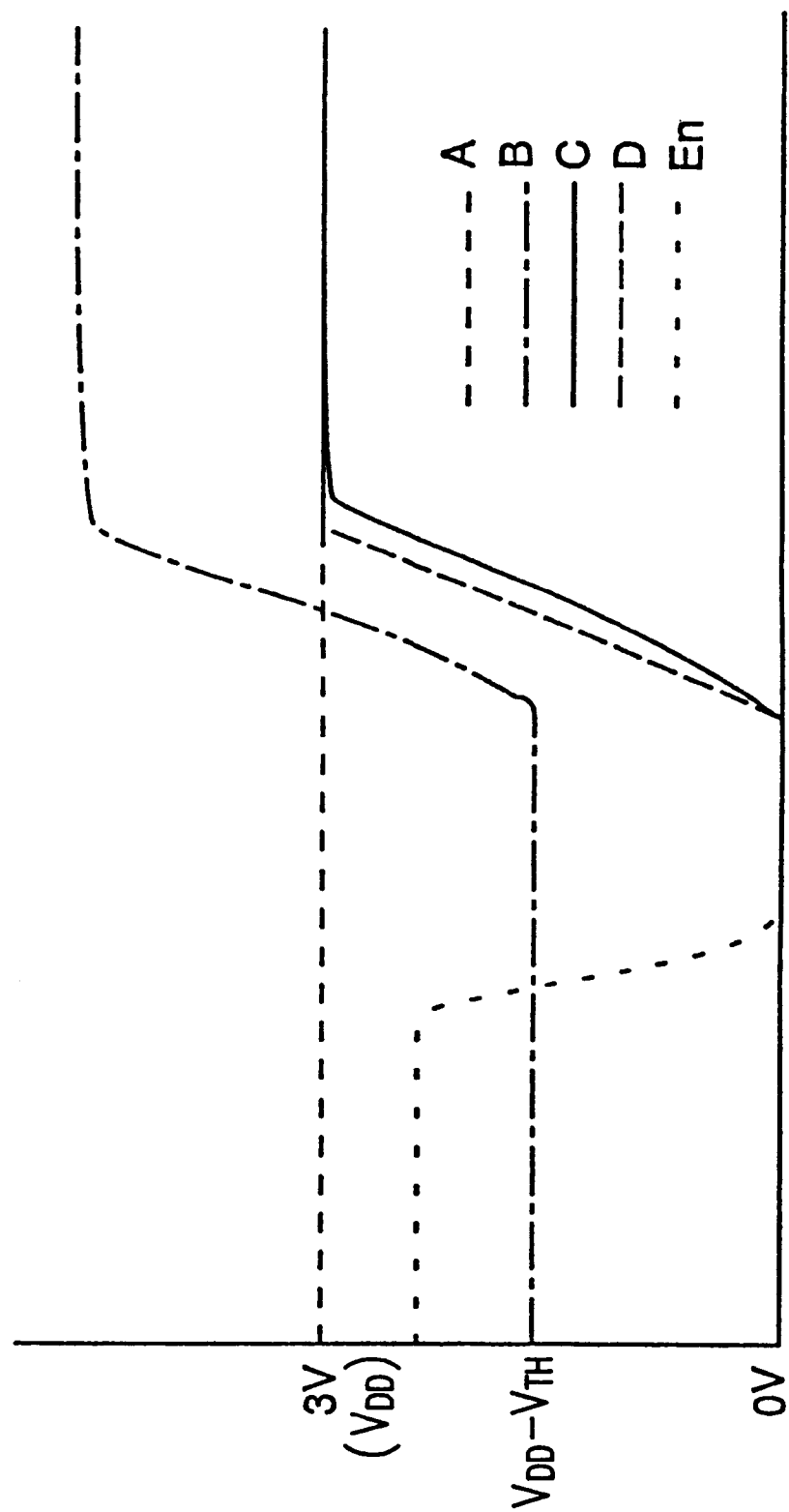
FIG. 2 is a waveform diagram illustrating operating waveforms of the bootstrap circuit of FIG. 1.

Then, when the node D changes from the low level to the high level, the voltage level at the node C also increases via the NMOS transistor $T_2$ as illustrated in FIG. 2. While current is cut off by the separation transistor $T_1$, the potential difference between the node C and the node B is maintained at a constant level. Therefore, a voltage of the current voltage level $V_{DD}-V_{Th}$ plus the voltage level at the node C appears at the node B.

As a result, the NMOS transistor $T_2$ is overdriven, and the potential at the node C increases to the high voltage level ($V_{DD}$) applied to the node D.

Thus, when such a bootstrap circuit is used as an output buffer for output compensation, it is possible to increase a reduced high level output from the preceding pass transistor logic circuit to the power supply voltage ($V_{DD}$) without using a PMOS transistor.

EXAMPLE 1

Next, an inverter circuit as a semiconductor IC according to Example 1 of the present invention will be described. The semiconductor IC uses the above-described bootstrap circuit as an output buffer for output compensation of the pass transistor logic circuit.

As described above, in a semiconductor IC using a pass transistor logic circuit, the high level signal which has been reduced through the pass transistor logic circuit can be restored, without using a PMOS transistor, by providing an NMOS transistor $T_1$ (which functions as a pull-up transistor and a separation transistor) and the bootstrap capacitor $C_B$. Thus, the inverter circuit of this example uses the above-described bootstrap circuit as an output buffer for output compensation of the pass transistor logic circuit.

Figure 3:
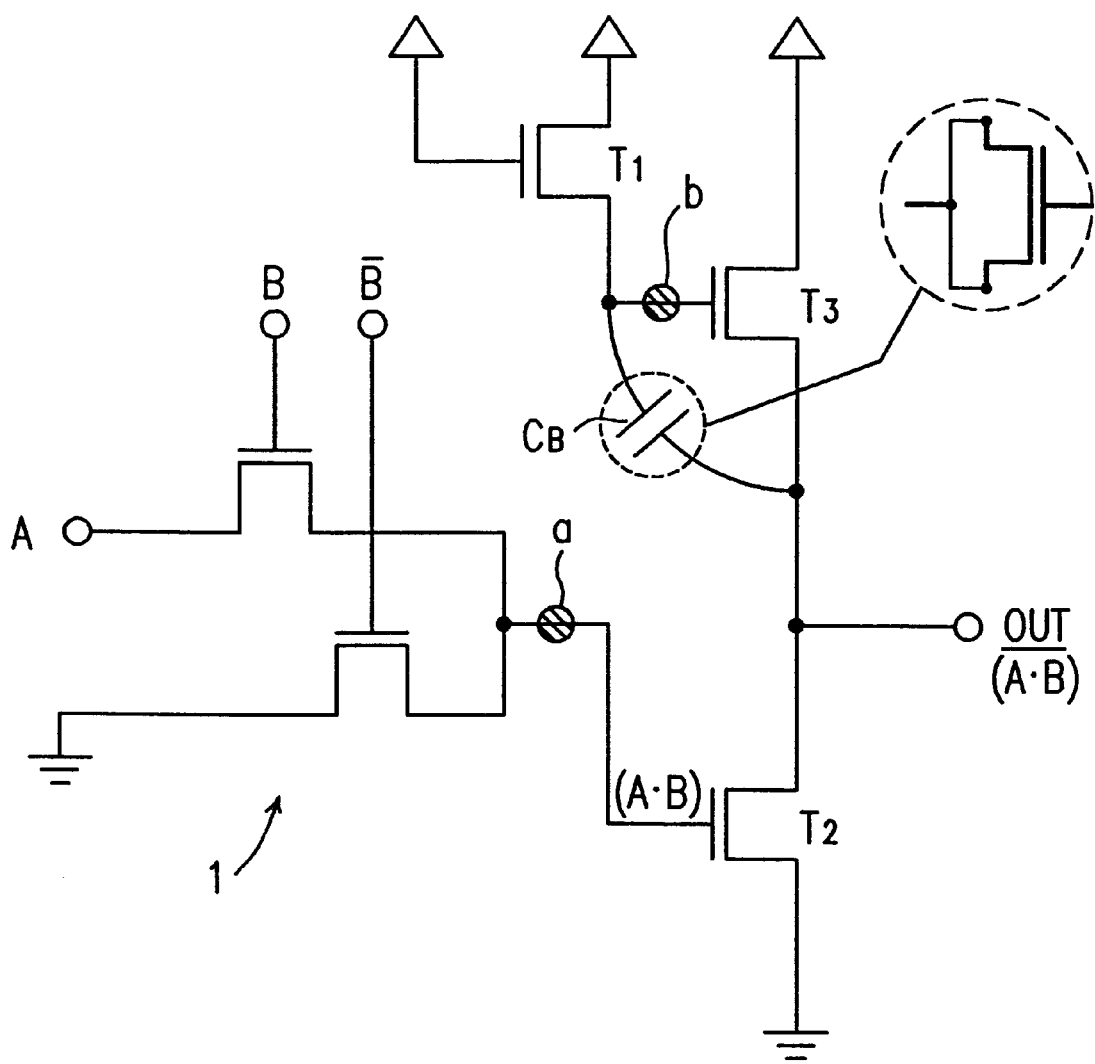
FIG. 3 is a circuit diagram illustrating an inverter circuit according to Example 1 of the present invention.

FIG. 3 illustrates the inverter circuit. The inverter circuit includes an output buffer for output compensation subsequent to the a pass transistor logic circuit 1. The output buffer includes NMOS transistors $T_1$, $T_2$ and $T_3$ and a bootstrap capacitor $C_B$. The operation of the inverter circuit will be described below.

Referring to FIG. 3, the potential at a node b is at a high level ($V_{DD}-V_{TH}$) by the pull-up transistor $T_1$ which is floating. Thus, the NMOS transistor $T_1$ serves as a separation transistor.

When an input A•B from the pass transistor logic circuit (=node a) is at a high level, and the NMOS transistor $T_2$ is in an "ON" state, the output is at a low level. Since the NMOS transistor $T_3$ is always in an "ON" state, the conductance of the NMOS transistor $T_2$ should be designed to be relatively large as compared with that of the NMOS transistor $T_3$.

When the input A•B (=node a) goes low, the inverter output OUT (A•B bar) is charged by the NMOS transistor $T_3$, and the potential thereof increases.

Accordingly, the potential at b increases to a level greater than the power supply voltage ($V_{DD}$) by the coupling effect with the bootstrap capacitor $C_B$, thereby overdriving the NMOS transistor $T_3$.

By setting the capacitance value of the bootstrap capacitor $C_B$ to an appropriate value based on the above-described operation principle, it is possible to form an inverter circuit without the deterioration of the high level output using a circuit configuration where the pass transistor logic circuit is formed using only NMOS transistors.

In such an inverter circuit, when the output OUT is at the high level, the output OUT is always pulled up to the power supply voltage $V_{DD}$ via the overdriven NMOS transistor $T_3$. Therefore, it is not necessary to maintain the level static, and the high level is always ensured at the output OUT.

As described above, according to Example 1 of the present invention, it is possible to form the pass transistor logic circuit only by using NMOS transistors and thereby reduce the chip area from that of the conventional pass transistor logic circuit.

In addition, the pass transistor logic circuit can be produced by the conventional NMOS process, thereby considerably reducing the turn around time of the circuit. Moreover, a PMOS region is not required, which also facilitates the reduction of the chip area.

In the circuit of Example 1, since a DC path from the power supply to the ground (i.e., a DC path from power supply→NMOS transistor $T_3$→NMOS transistor $T_2$→ground) is formed, channel width W of the NMOS transistor $T_3$ should be designed to be small while channel length L thereof should be designed to be large in view of reducing the power consumption.

However, when W of the NMOS transistor $T_3$ is small while L thereof is large, there may be a problem (i.e., sizing of the NMOS transistor $T_3$) in driving a subsequent-stage circuit at a high level.

This problem can be solved by an inverter circuit according to Example 2 of the present invention.

EXAMPLE 2

Figure 4:
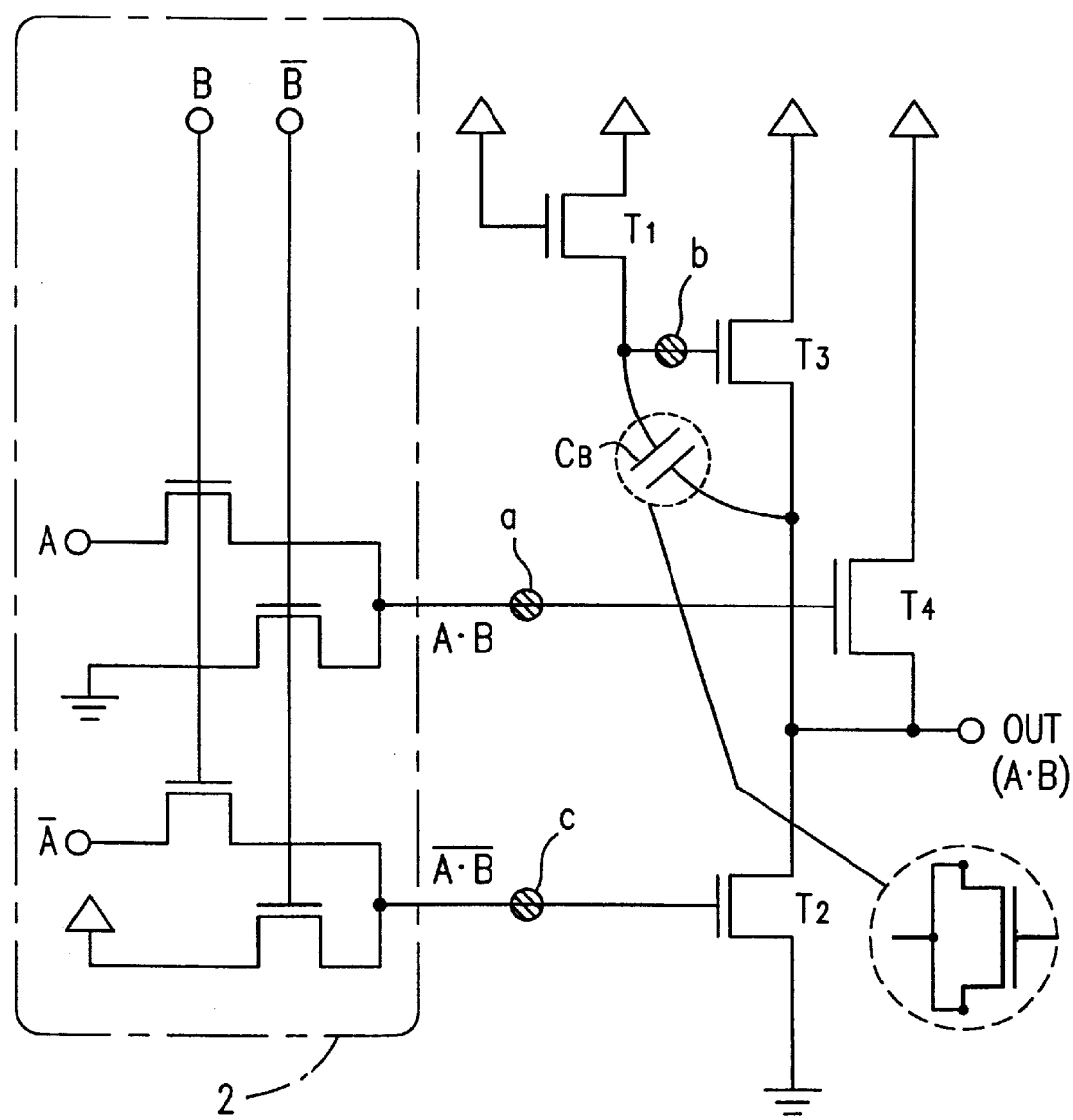
FIG. 4 is a circuit diagram illustrating an inverter circuit according to Example 2 of the present invention.

FIG. 4 illustrates an inverter circuit according to Example 2 of the present invention. The inverter circuit uses complementary outputs (A•B and A•B bar) of a pass transistor logic circuit 2, and includes an additional NMOS transistor $T_4$ (a driving force complementary NMOS transistor), thus solving the above-described problem (i.e., lack of the driving force caused by sizing of the NMOS transistor $T_3$), while reducing the power consumption.

The sizing of the NMOS transistor $T_3$ is solved by providing the NMOS transistor $T_4$. In FIG. 4, when the input A•B bar from the pass transistor logic circuit 2 is at a high level (i.e., when the input A•B is at a low level), the NMOS transistor $T_4$ does not operate, and operates only when the input A•B is at the high level. Thus, it is possible to complement the driving force of the NMOS transistor $T_3$, thus solving the lack of the sizing of the NMOS transistor $T_3$.

Other than the above, the operation principle of Example 2 is substantially the same as that of Example 1, where a reduction-free high level is ensured at the output of the pass transistor logic circuit 2 by providing the pull-up and separation transistor $T_1$ and the bootstrap capacitor $C_B$. This will be described below.

When the input A•B bar from the pass transistor logic circuit 2 is at the high level (i.e., when the input A•B (=node a) is at the low level), the NMOS transistor $T_2$ is in an "ON" state, and therefore the output of OUT (A•B) is at the low level.

When the input A•B bar goes low (i.e., when the input A•B (=node a) goes high), the output OUT is driven by the NMOS transistor $T_3$, and the potential thereof increases. Accordingly, the potential at b increases to a level greater than the power supply voltage ($V_{DD}$) by the coupling effect with the bootstrap capacitor $C_B$, thereby overdriving the NMOS transistor $T_3$ and thus transmitting the reduction-free high level at the output.

Since the NMOS transistor $T_4$ transitions into an "ON" state, no problem occurs relative to the driving force for a subsequent-stage circuit even when W of the NMOS transistor $T_3$ is small while L thereof is large.

Figure 5:
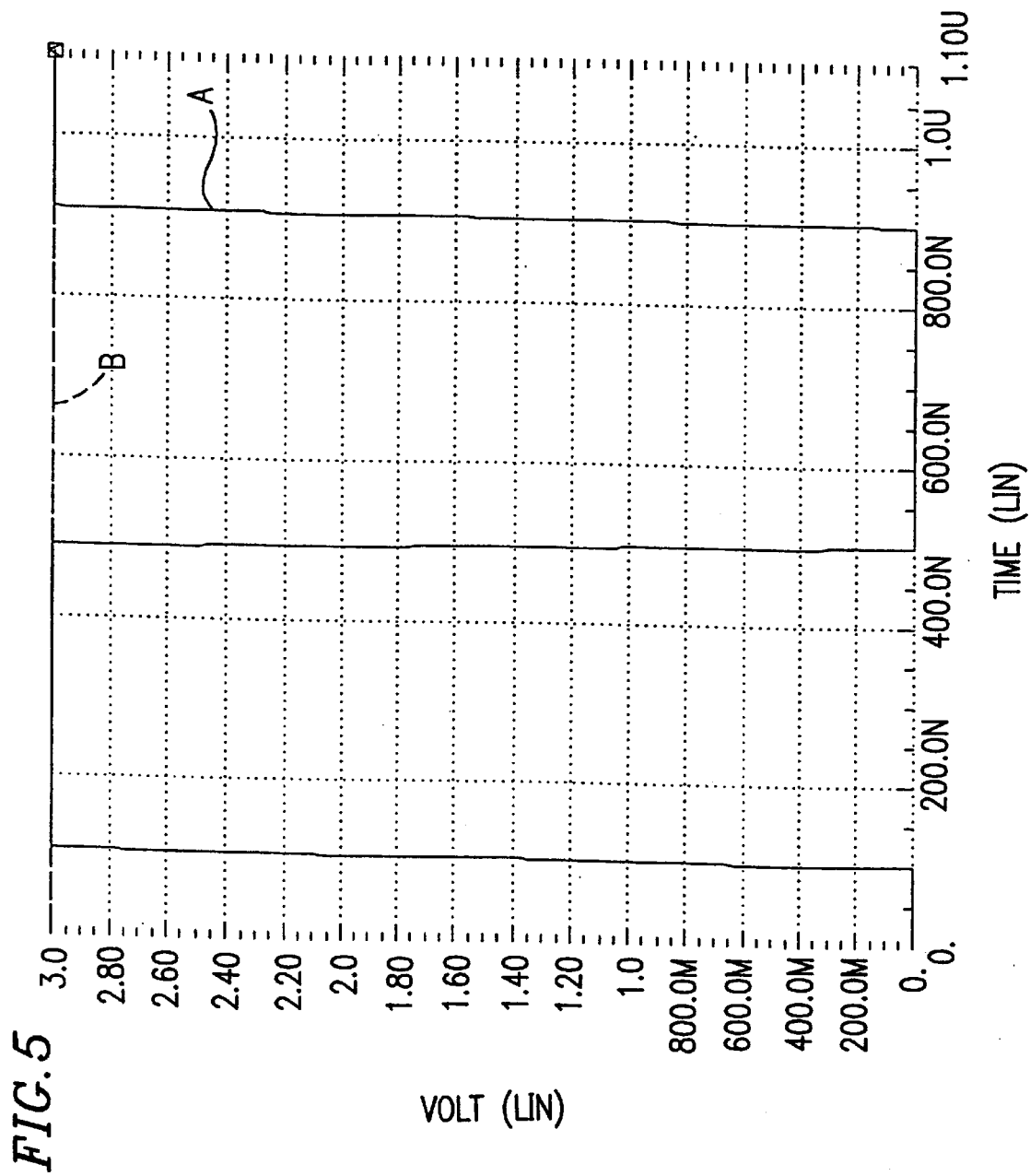
FIG. 5 is a simulation waveform diagram illustrating input waveforms input to pass transistor logic circuit inputs A and B of the circuit illustrated in FIG. 4.
Figure 6:
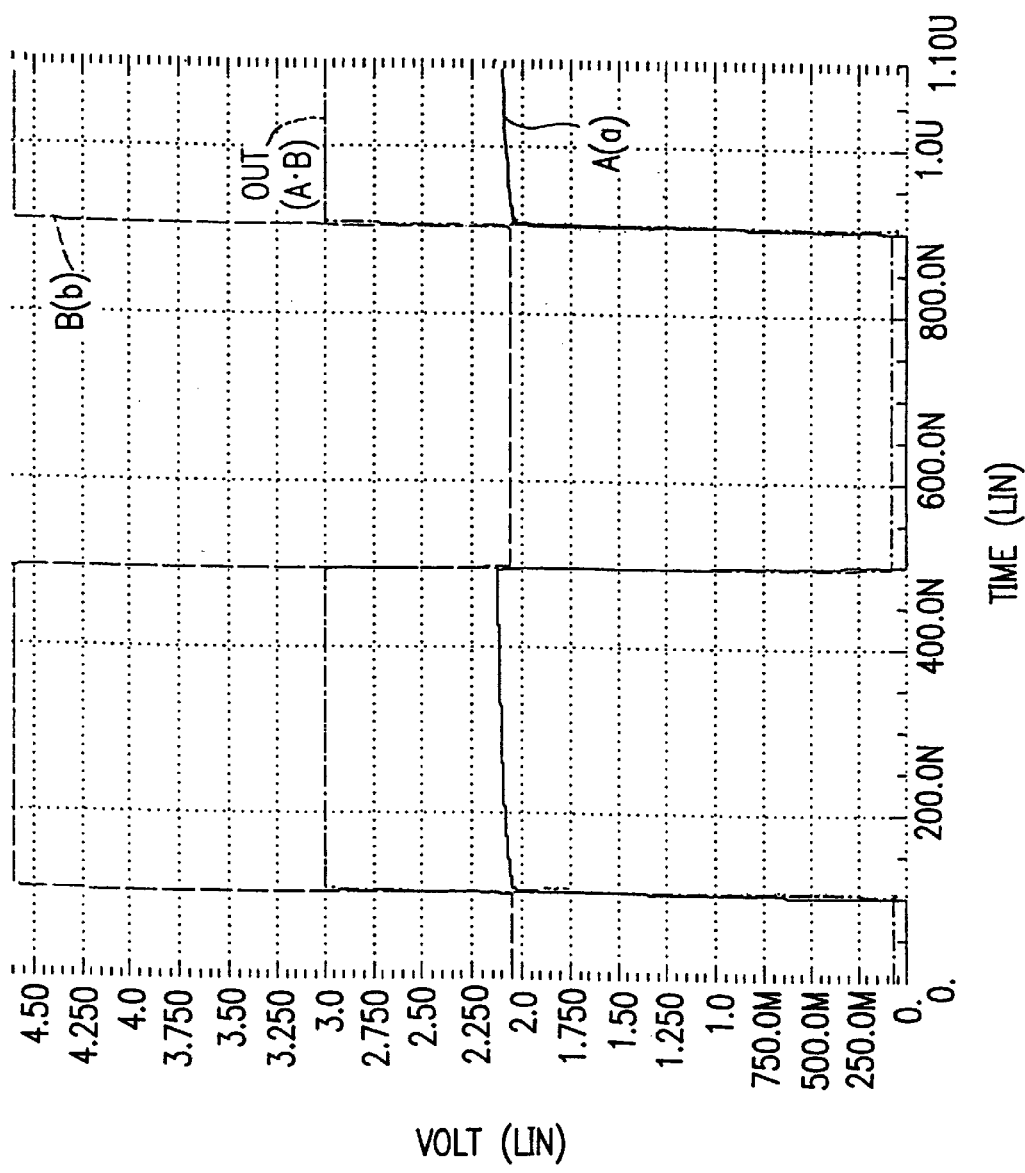
FIG. 6 is a simulation waveform diagram illustrating operating waveforms at an output OUT (A•B) of the circuit illustrated in FIG. 4.

FIG. 5 illustrates input waveforms (simulation waveforms) to the pass transistor inputs A and B, respectively, in the circuit illustrated in FIG. 4. FIG. 6 illustrates operating waveforms at the output OUT (A•B).

In this way, Example 2 provides an advantage that the power consumption thereof can be further reduced from that of the inverter circuit of Example 1.

In the above-described examples, a specific capacitance value of the bootstrap capacitor $C_B$ cannot be generally shown since it depends on the particular process. A larger capacitance is required when a faster operation is desired. However, it does not have to be particularly large in general.

The present invention is not limited to an inverter circuit, as described above, but can be applied to a broad range of semiconductor ICs having a pass transistor logic circuit.

As described above, according to the present invention, a pass transistor logic circuit can be formed only with NMOS transistors, whereby it is possible to reduce the chip area as compared with the conventional pass transistor logic circuit which uses a PMOS transistor as necessary. Thus, it is possible to reduce the chip area of the pass transistor logic circuit while reducing the power consumption and increasing the operating speed.

Moreover, the present invention makes it possible to improve the production yield of a semiconductor IC and reduce the cost therefor.

In an embodiment of the present invention, a driving force complementary NMOS transistor is additionally provided, whereby it is possible to further reduce the power consumption of the semiconductor IC.

In another embodiment of the present invention, it is possible to produce a semiconductor IC with a conventional NMOS process, which is simpler than the CMOS process, thereby considerably reducing the turn around time. Moreover, a PMOS region is not necessary, which also facilitates the reduction of the chip area.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor integrated circuit, comprising:
 a pass transistor logic circuit; and
 an output buffer for compensating for an output level of the pass transistor logic circuit,
 wherein the output buffer includes a bootstrap circuit, and a DC path from a first power source voltage supply via a first transistor and a second transistor to a ground,
 wherein a capacitor in the bootstrap circuit is connected between a gate of the first transistor and an output terminal,
 the first transistor has a relatively small channel width and a relatively large channel length in comparison to the second transistor,
 a first output of the pass transistor logic circuit is applied to a gate of the second transistor,
 the pass transistor logic circuit, the output buffer including the bootstrap circuit, the first and the second transistors are respectively constituted by NMOS transistors,
 the output buffer additionally includes a driving force complementary transistor disposed between a second power source voltage and the output terminal, and a second output of the pass transistor logic circuit complementary to the first output is supplied to a gate of the driving force complementary transistor.

2. The semiconductor integrated circuit according to claim 1, wherein the bootstrap circuit comprises a separation transistor connected between a third power source voltage supply and the gate of the first transistor which is electrically coupled with the capacitor, and wherein a gate of the separation transistor is connected to a fourth power source voltage supply.

3. The semiconductor integrated circuit according to claim 2, wherein a power source voltage of each of the first, the third and the fourth power source voltage supplies is equal.

4. The semiconductor integrated circuit according to claim 1, wherein the pass transistor logic circuit comprises a plurality of independent data inputs.

5. The semiconductor integrated circuit according to claim 1, wherein a power source voltage of each of the first and the second power source voltage supplies is equal.

6. A semiconductor integrated circuit, comprising:

a pass transistor logic circuit; and an output buffer for compensating for an output level of the pass transistor logic circuit, wherein the output buffer includes a bootstrap circuit which comprises a capacitor connected between a gate of a first transistor and an output terminal and a separation transistor, the gate of the first transistor is electrically coupled with the separation transistor and the capacitor, a gate of the separation transistor is connected to a first power source voltage supply, the output buffer further includes a DC path from a second power source voltage supply via the first transistor and a second transistor to a ground, and a driving force complementary transistor disposed between a third power source voltage supply and the output terminal, and a first output of the pass transistor logic circuit is applied to a gate of the second transistor and a second output of the pass transistor logic circuit complementary to the first output is supplied to a gate of the driving force complementary transistor.

7. The semiconductor integrated circuit according to claim 6, wherein the pass transistor logic circuit and output buffer including the bootstrap circuit, the first transistor, and the separation transistor are respectively constituted by NMOS transistors.

8. The semiconductor transistor integrated circuit according to claim 6, wherein the second transistor is an NMOS transistor.

9. The semiconductor integrated circuit according to claim 6, wherein the first transistor has a relatively small channel width and a relatively large channel length in comparison to the second transistor.

10. The semiconductor integrated circuit according to claim 6, wherein the pass transistor logic circuit comprises a plurality of independent data inputs.

11. The semiconductor integrated circuit according to claim 7, wherein a power source voltage of each of the first and the second power source voltage supplies is equal.

12. The semiconductor integrated circuit according to claim 6, wherein a power source voltage of each of the first, the second, and the third power source voltage supplies is equal.

* * * * *